(12) United States Patent
Takai (10) Patent No.: US 8,400,097 B2
(45) Date of Patent: Mar. 19, 2013

(54) PULSE PERIOD MEASUREMENT METHOD

(75) Inventor: Kazumasa Takai, Kagamigahara (JP)

(73) Assignees: Sanyo Semiconductor Co., Ltd. (JP); Semiconductor Components Industries, LLC, Phoenix, AZ (US)

( * ) Notice: Subject to any disclaimer, the term of this patent is extended or adjusted under 35 U.S.C. 154(b) by 666 days.

(21) Appl. No.: 12/690,989

(22) Filed: Jan. 21, 2010

(65) Prior Publication Data

US 2010/0188103 A1    Jul. 29, 2010

(30) Foreign Application Priority Data

Jan. 23, 2009   (JP) ................................. 2009-012795

(51) Int. Cl.
*H03K 5/05* (2006.01)
*H02P 6/06* (2006.01)
(52) U.S. Cl. .................. 318/603; 318/629; 318/636
(58) Field of Classification Search ............ 318/568.24, 318/594, 599, 600, 603, 611, 629, 636
See application file for complete search history.

(56) References Cited

U.S. PATENT DOCUMENTS

| | | | | |
|---|---|---|---|---|
| 3,832,640 A | * | 8/1974 | Cederquist et al. | 377/47 |
| 4,250,557 A | * | 2/1981 | Gaertner | 708/6 |
| 4,506,201 A | * | 3/1985 | Tsuneki | 318/603 |
| 5,317,558 A | | 5/1994 | Yagami et al. | |
| 5,986,845 A | * | 11/1999 | Yamaguchi et al. | 360/75 |
| 6,670,831 B2 | * | 12/2003 | Mashimo | 327/34 |
| 8,085,227 B2 | * | 12/2011 | Ezaki et al. | 345/82 |

FOREIGN PATENT DOCUMENTS

JP       5-327430 A     12/1993

* cited by examiner

*Primary Examiner* — Bentsu Ro
(74) *Attorney, Agent, or Firm* — Cantor Colburn LLP (57) ABSTRACT

The effect of chattering on the measurement of the pulse period is reduced. The pulse period representing the rise interval of target pulses appearing in a pulse signal PI is measured. The pulse signal PI is sampled in synchronization with a measurement clock CLK. Measurement of a designated inhibition period is started in synchronization with the fall of the signal PI. Measurement of the current pulse period is completed and measurement of a new pulse period is started if the inhibition period has elapsed at the rise of the signal PI. Counting of the current pulse period is continued if the inhibition period has not elapsed.

5 Claims, 7 Drawing Sheets

PULSE PERIOD MEASUREMENT METHOD

CROSS-REFERENCE TO RELATED APPLICATION

The present application claims priority from Japanese application JP 2009-012795 filed on Jan. 23, 2009, the content of which is hereby incorporated by reference into this application.

BACKGROUND OF THE INVENTION

1. Field of the Invention

The present invention relates to a method of measuring a period of a pulse in which noise such as chattering may occur in the pulse end sections.

2. Description of the Related Art

The speed of a motor can be controlled by obtaining from a motor module a pulse signal PI in which the period varies in accordance with the rotational speed ω of the motor. A motor speed controller measures the period of the pulses appearing in the pulse signal, detects the rotational speed ω of the motor from that period, and drives the motor so that the rotational speed ω is brought to a target value.

Chattering may occur at the edges (pulse ends) of this pulse signal, that is, at the timing when the signal switches from Low level (L level) to High level (H level) or from H level to L level. Such chattering and other noise become an error factor in the measurement of the pulse period. In response to this problem, attempts have hitherto been made to reduce the effect of chattering when detecting pulse edges and to improve the precision of measurement of the pulse period.

Figure 7:
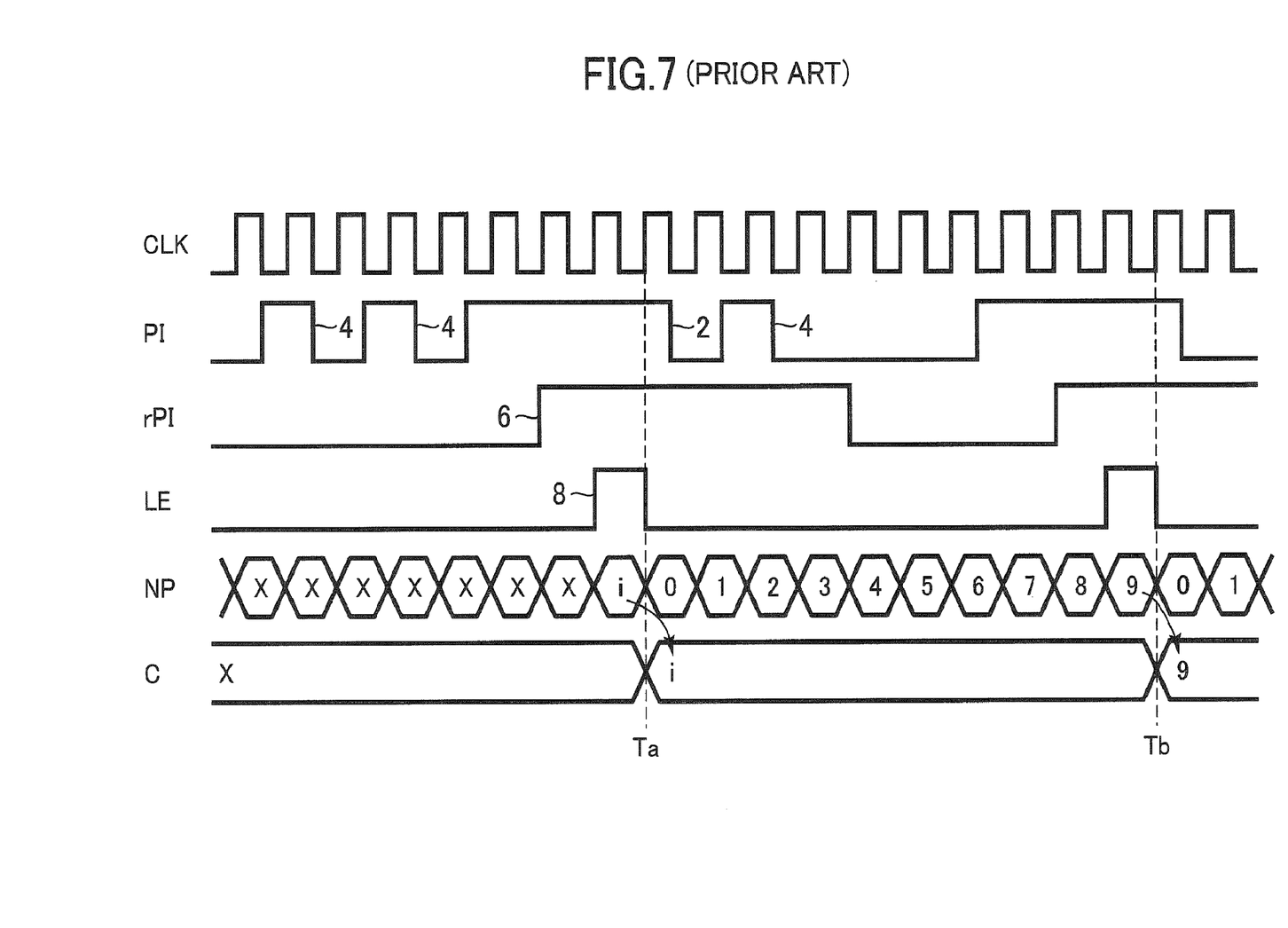
FIG. 7 is a signal waveform chart illustrating a conventional pulse period measurement method.

FIG. 7 is a signal waveform chart illustrating a conventional pulse period measurement method. In FIG. 7, the horizontal axis is the time axis, and a plurality of signals CLK, PI, rPI, LE, NP, and C are arrayed vertically, with their respective time axes in alignment. The pulse signal PI input from the motor module is sampled, for example, at the timing of the rise of a reference clock CLK. If the sampled value changes and then remains the same value consecutively over a designated number of times $n_D$, (in FIG. 7 $n_D$=2), a determination is made that the timing is the pulse edge. From the pulse signal rPI for which the pulse edge was thus established, the chattering 4 appearing on the leading and trailing edges of the pulse 2 of the pulse signal PI can be eliminated. The pulse 6 appearing in the pulse signal rPI is sampled at the timing of the rise of the clock signal CLK, and when, for example, the sampled signal level changes from L to H, an edge detection pulse 8 is generated in the detection signal LE of the rise of the pulse 6. The period of the pulse 8 is measured by the count value NP of a counter for counting up values in synchronization with the clock signal CLK. That is, the count value NP at the fall time (times Ta and Tb) of the pulse 8 is latched and output as a period count value of the pulse signal PI, the count value NP is reset at that fall, and counting up to measure the next period is started.

Patent Document

Japanese Laid-open Patent Publication No. 5-327430

SUMMARY OF THE INVENTION

In the above conventional method, the position where the edge of the pulse signal PI is detected is at the timing after the chattering subsides. Therefore, there was a problem of variability in the measurement values of the pulse period due to the variability of the chattering duration period.

Even when there is no chattering, a clock latency DL that corresponds to $n_D$, is produced in the edge detection of the pulse signal PI, and the processing delay DL is further increased in the case when there is chattering. The timing for acquiring the pulse period is delayed by that amount, and this may lead to problems such as decreases in the trackability and stability of operation in motor drive control.

The above processing delay is given by the product of the period $\tau_{CLK}$ of the reference clock CLK and $n_D$. Conventionally, the period $\tau_{CLK}$ and $n_D$ are set to respective constant values within the range $R_\omega$ of the rotational speed ω being controlled. Therefore, the magnitude of the processing delay DL remains constant substantially within that range $R_\omega$, without dependence on ω. Here, the frequency of the chattering also varies in accordance with the frequency of the pulse signal PI, and the period of the chattering at the lower limit ω of the range $R_\omega$, may become the longest. Therefore, if $n_D$, is set so that no determination is made that the chattering at the lower limit is a regular pulse, then chattering at any ω within the range of $R_\omega$ can be eliminated. In this conventional arrangement, as the rotation of the motor is faster and the pulse period is shorter, the effect of the above-described processing delay DL is greater, and the above-described problem becomes more significant.

The present invention was made in order to solve the above problem, and the invention provides a pulse period measurement method that can measure a pulse period with good precision and with little processing delay time, and therefore makes possible the improvement of stability in motor speed control in which this method is used.

The pulse period measurement method according to the present invention is a method for measuring a pulse period on the basis of a pulse end in transition from a first state to a second state relative to a target pulse appearing in an input signal, comprising:

a state detection step for sampling the input signal and detecting the signal state at a designated sampling period;

a inhibition period clocking step for starting the process of clocking a designated inhibition period at a first change in which the signal state changes from the second state to the first state; and a period measurement step for completing the process of measuring the current pulse period and starting the process of measuring a new pulse period if the inhibition period has elapsed by the time of a second change in which the signal state changes from the first state to the second state, and continuing the process of counting the current pulse period if the inhibition period has not elapsed.

DESCRIPTION OF THE PREFERRED EMBODIMENTS

Embodiments of the present invention (henceforth, "embodiments") are explained below with reference to the drawings.

[Controller Structure]

Figure 1:
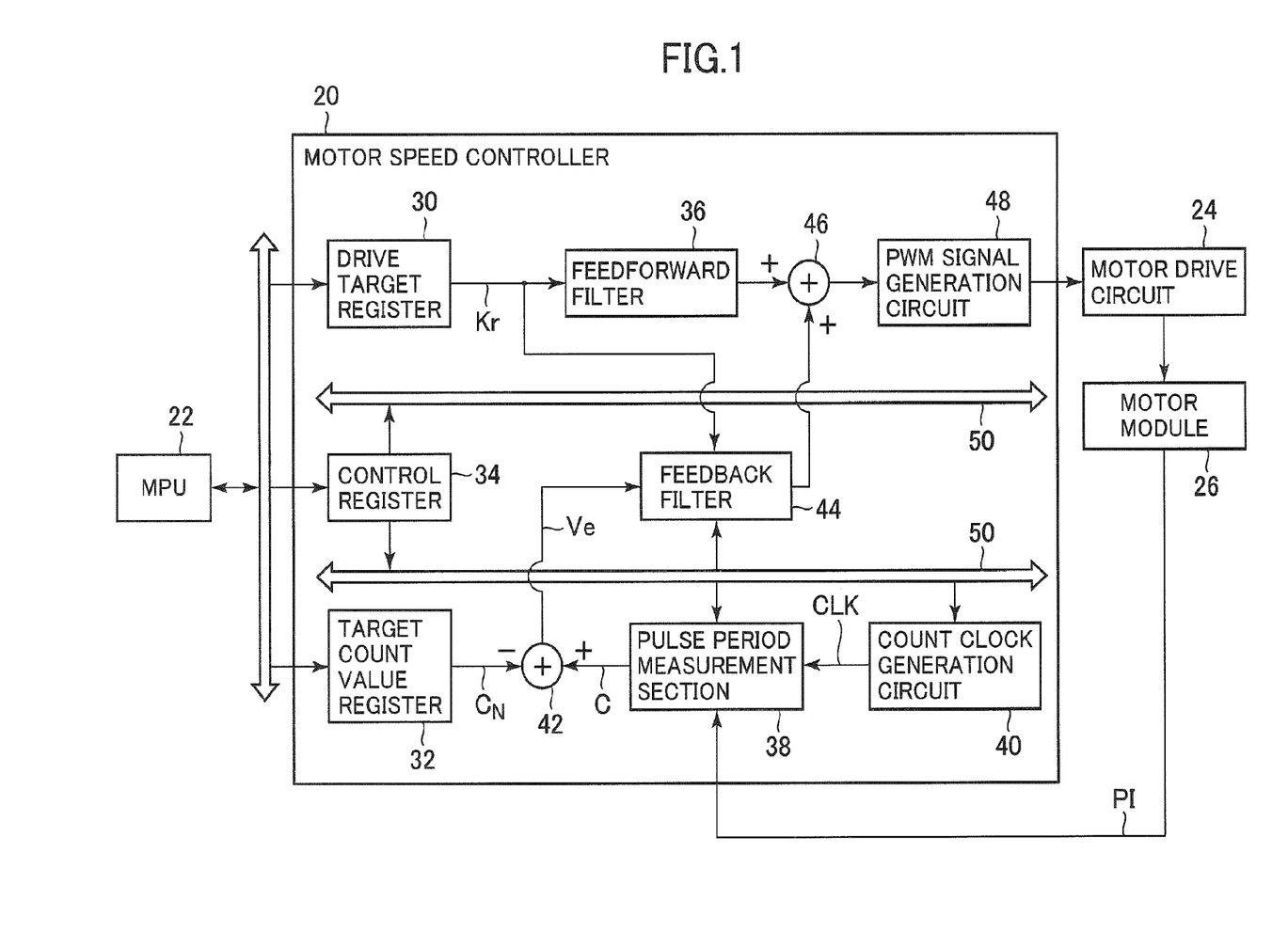
FIG. 1 is a schematic block diagram illustrating the functional structure of a motor speed controller according to an embodiment of the present invention.

FIG. 1 is a schematic block diagram illustrating the functional structure of a motor speed controller 20 according to an embodiment of the present invention. The motor speed controller 20 is set parameters such as control target values from an MPU (Micro Processing Unit) 22, and generates a PWM (Pulse Width Modulation) signal for a motor drive circuit 24. The motor drive circuit 24 has an H bridge circuit, and converts the PWM signal from the motor speed controller 20 to a drive signal for a motor module 26 by using the H bridge circuit. The motor module 26 includes a DC motor, a drive mechanism, and an encoder. The drive mechanism, for example, is a zoom mechanism of a camera. The DC motor rotates at a rotational speed that is substantially proportional to the voltage of the drive signal from the motor drive circuit 24, and can switch the direction of rotation in accordance with the polarity of the voltage. The encoder detects the amount of rotation of the DC motor directly or indirectly from the amount of driving of the drive mechanism. The encoder generates a pulse for each designated angle of rotation of the DC motor, and the pulse is input as a pulse signal PI to the motor speed controller 20.

Figure 2:
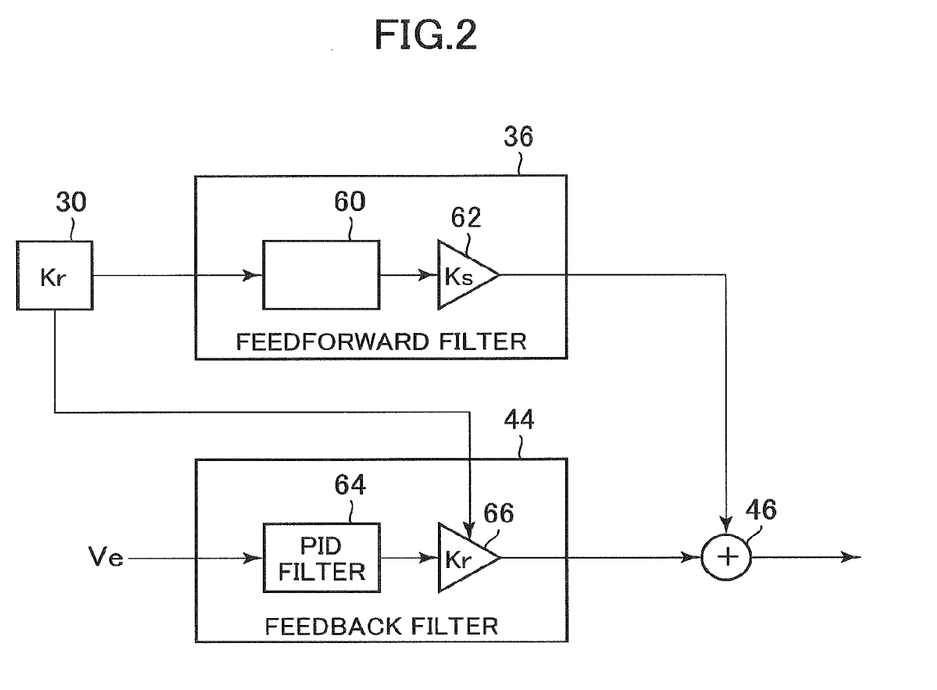
FIG. 2 is a block diagram of the drive target register, feedforward filter, feedback filter, and synthesis circuit of the motor speed controller according to an embodiment of the present invention.

The motor speed controller 20 has a drive target register 30, a target count value register 32, a control register 34, a feedforward filter 36, a pulse period measurement section 38, a count clock generation circuit 40, a comparison circuit 42, a feedback filter 44, a synthesis circuit 46, a PWM signal generation circuit 48, and a bus 50. FIG. 2 is a block diagram of the drive target register 30, feedforward filter 36, feedback filter 44, and synthesis circuit 46 in the motor speed controller 20.

The drive target register 30 and feedforward filter 36 constitute a feedforward control section for generating a target instruction signal that is defined in accordance with a target rotational speed $\omega_T$, and setting the rotational speed of the motor to the target rotational speed by feedforward control.

The drive target register 30 stores a target setting value Kr that is set in accordance with the target rotational speed $\omega_T$ of the motor. The target setting value Kr is set as a value obtained by attaching a sign that corresponds to the direction (rotational direction) of the target rotational speed $\omega_T$ to the absolute value proportional to the magnitude of the target rotational speed $\omega_T$. The target setting value Kr is stored in the drive target register 30.

The feedforward filter 36 generates a target instruction signal on the basis of the target setting value Kr stored in the drive target register 30. As shown in FIG. 2, the feedforward filter 36 has a filter 60 whose transfer function corresponds to the motor as the object of driving, and a multiplier 62. The target setting value Kr read from the drive target register 30 is input to the multiplier 62 via the filter 60. Although the target rotational speed $\omega_T$ can be variably set in the motor speed controller 20, the multiplication factor (gain) Ks of the multiplier 62 is set as a constant value that does not depend on the variably set target rotational speed $\omega_T$. The multiplier 62 generates a target instruction signal by multiplying Ks by the output signal of the filter 60 that corresponds to the target setting value Kr.

Ks can be set to an upper-limit value $\omega_{MAX}$ of a predetermined adjustable range for the target rotational speed $\omega_T$. In this case, the target setting value Kr is set as a relative value obtained by dividing the target rotational speed $\omega_T$ by the set upper-limit value $\omega_{MAX}$.

The target count value register 32, pulse period measurement section 38, and feedback filter 44 constitute a feedback control section that performs feedback control for generating an error signal Ve that corresponds to the difference between the present rotational speed $\omega$ and the target rotational speed $\omega_T$, generating a compensation instruction signal on the basis of the error signal Ve, and bringing the rotational speed $\omega$ closer to the target rotational speed $\omega_T$.

The pulse period measurement section 38 inputs the pulse signal PI from the motor module 26, and detects the pulses appearing in the pulse signal PI. The pulses are generated substantially in accordance with the rotation of the motor, and the pulse period $\tau_P$ varies in inverse proportion to the rotational speed $\omega$ of the motor. The pulse period measurement section 38 measures the pulse period $\tau_P$ by a count clock (reference clock) CLK. That is, the pulse period measurement section 38 counts the count clock CLK during the pulse period $\tau_P$ at the present rotational speed $\omega$ and determines a measured count value C that corresponds to the pulse period $\tau_P$.

The count clock generation circuit 40 divides the frequency of a master clock having a designated frequency to generate a count clock CLK, and supplies the clock to the pulse period measurement section 38. The count clock generation circuit 40 varies the frequency $F_C$ of the count clock CLK in accordance with the target rotational speed $\omega_T$ of the motor, and creates a condition in which the count value C from the pulse period measurement section 38 in the pulse period $\tau_P$ that corresponds to the target rotational speed $\omega_T$ remains a constant target count value $C_N$ that does not depend on the target rotational speed $\omega_T$. For example, the count clock generation circuit 40 can use the target setting value Kr stored by the drive target register 30 to keep the target count value $C_N$ constant by varying the frequency $F_C$ in proportion to the target setting value Kr.

The target count value $C_N$ is set in the target count value register 32. The comparison circuit 42 determines the difference between the measured count value C output from the pulse period measurement section 38 and the target count value $C_N$ stored by the target count value register 32, and generates an error signal Ve that corresponds to that difference ($C-C_N$).

The feedback filter 44 generates a compensation instruction signal for adjusting the rotational speed $\omega$ to the target rotational speed $\omega_T$ on the basis of the error signal Ve. As shown in FIG. 2, the feedback filter 44 has a PID filter 64 and a multiplier 66. The error signal Ve from the comparison circuit 42 is input to the PID filter 64. The PID filter 64 subjects the error signal Ve to a P operation, an I operation, and a D operation in parallel, and then adds, combines, and outputs the processing results.

The multiplier 66 multiplies the factor (scaling factor) by the output of the PID filter 64. The output signal of the multiplier 66 is output as a compensation instruction signal from the feedback filter 44.

Here, the scaling factor of the multiplier 66 is set to a value that is proportional to the target rotational speed $\omega_T$. The compensation instruction signal is thereby scaled by a factor that corresponds to the target rotational speed $\omega_T$. In the present embodiment, the target setting value Kr is defined by a relative value of the target rotational speed $\omega_T$ with respect to the upper-limit value $\omega_{MAX}$ as described above, and the scaling factor of the multiplier 66 is set to the target setting value Kr stored in the drive target register 30. That is, when the target setting value Kr is set for the drive target register 30 from the MPU 22, the absolute value thereof becomes automatically used as the scaling factor of the multiplier 66, and there is no need to set the scaling factor separately.

The synthesis circuit 46 and the PWM signal generation circuit 48 constitute a drive control section for controlling the driving of the motor. The synthesis circuit 46 adds the target instruction signal output from the feedforward filter 36 and the compensation instruction signal output from the feedback filter 44, and generates a composite signal. The PWM signal generation circuit 48 generates a PWM signal in which the duty ratio varies in accordance with the value of the composite signal, and outputs the signal to the motor drive circuit 24.

Parameters that are stored in the control register 34 can be rewritten from the MPU 22, and the operations and processing contents of each section of the motor speed controller 20 can be controlled via those parameters.

As described above, the motor speed controller 20 varies the frequency $F_C$ of the count clock CLK in accordance with the target rotational speed $\omega_T$, and keeps the target count value within the pulse period $\tau_P$ to a constant value $C_N$ that does not depend on the target rotational speed $\omega_T$. The weight $\beta$ of the count value $C_N$ per unit quantity of the frequency $F_P$ of the pulse period PI is thereby brought to $\beta=C_N/F_P$. An error signal Ve that is generated on the basis of the count value $C_N$ having weight $\beta$ is input to the feedback filter 44. The motor speed controller 20 scales the compensation instruction signal by multiplying the scaling factor that is proportional to the target rotational speed $\omega_T$ in the multiplier 66 of the feedback filter 44. Because the scaling factor is proportional to the frequency $F_P$, the gain of the feedback control in the motor speed controller 20 is a value that corresponds to the product of the weight $\beta$ and the scaling factor of the multiplier 66, and is a constant value that does not depend on the target rotational speed $\omega_T$.

The target setting value Kr can be set, for example, as the target rotational speed $\omega_T$ itself, rather than as a relative value of the target rotational speed $\omega_T$ with respect to the upper-limit value $\omega_{MAX}$. In that case, the gain in the multiplier 62 should be set to 1 in the arrangement described above, and the arrangement can also be constituted so that the multiplier 62 itself is omitted.

In the arrangement described above, in the case when the target rotational speed $\omega_T$ is changed, the scaling factor of the multiplier 66 is automatically set in the contents of the drive target register 30. On the other hand, because the target count value $C_N$ doesn't change even when the target rotational speed $\omega_T$ is changed, there is no need to change the contents of the target count value register 32.

It should be noted that even in the conventional arrangement in which the target count value is not kept constant within the pulse period $\tau_P$, it is possible to keep the gain of feedback control at a constant level that does not depend on $\omega_T$ by providing only a multiplier 66 and changing the scaling factor by the square of $F_P$. However, the load on the digital computation in the multiplier 66 increases with the scaling factor. When the scaling factor is changed by the square of $F_P$, for example, the scaling factor must change by a factor of 10,000 in the case when $F_P$ changes by a factor of 100. This means that in the case when the multiplier 66 is constituted by a fixed-point digital arithmetic unit, it must be assumed that the number of places may change by 14 bits, and the increase of processing load and circuit size may become significant. On the other hand, in the constitution of the present invention, the range of variation of the number of places in the case when $F_P$ changes by a factor of 100 is 7 bits, and the load is comparatively low.

The processing of the digital filters such as the PID filter 64 may substantially involve addition and multiplication. In the present embodiment, the device additionally provided to the feedback filter 44 is a multiplier 66, and providing a divider is not necessary. Therefore, it is possible to perform the multiplication processing in the multiplier 66 by sharing an ALU (Arithmetic Logic Unit) that performs the processing of the above digital filter. It is thus possible to avoid additionally providing the multiplier 66 as a separate circuit, and a reduction in circuit size can be achieved.

The multiplier 66 can be placed in front of the PID filter 64, or respectively for each operation of P, I, and D in the PID filter 64.

[Operation During Switching of Target Rotational Speed $\omega_T$]

Next the operation of the motor speed controller 20 is explained. The motor speed controller 20 comprises a feedforward control means that includes a feedforward filter 36, and a feedback control means that includes a feedback filter 44, and these filters operate substantially in parallel. In the normal state, the feedforward control serves the role of keeping mainly the DC level of the rotational speed $\omega$ at the target rotational speed $\omega_T$, and the feedback control has the autonomous role of converging AC components of relatively small amplitude that are overlapped on the DC level.

The motor speed controller 20 can temporarily stop the feedback control when switching the target rotational speed $\omega_T$ in order to improve the dynamic response when starting rotation of the motor and at other times when switching the target rotational speed $\omega_T$.

In this operation, it is determined whether the present rotational speed $\omega$ is within a designated range $R_A$ with respect to the target rotational speed $\omega_T$. Out of the feedforward means and the feedback means, only the feedforward control means is started if the speed is out of the range $R_A$, and both of the means are started if the speed is within the range $R_A$.

For example, setting a designated threshold $\Delta_\omega$ can define the conditions so that the speed is within the range $R_A$ if $|\omega-\omega_T|\leq\Delta_\omega$, and out of the range $R_A$ if $|\omega-\omega_T|>\Delta_\omega$.

Whether the speed is within the range of $R_A$ can be determined, for example, on the basis of the error signal Ve. In view of this, the feedback filter 44 can be given an operation-switching function in which the operation of the PID filter 64 is stopped or restarted when the analysis is performed based on the error signal Ve.

One method of switching operation is to switch the feedback control on and off in accordance with the result of comparison of the deviation of rotational speed $|\omega-\omega_T|$ and the threshold $\Delta_\omega$ as described above. According to this method, the feedback control is not stopped if the deviation is at or below the threshold $\Delta_\omega$ even if the target rotational speed $\omega_T$ is changed. On the other hand, the feedback control is stopped if the deviation is above the threshold even if the target rotational speed $\omega_T$ is not changed. Another possible method is to temporarily stop the feedback control without regard to the magnitude of the deviation if the target rotational speed $\omega_T$ is changed, and to restart the feedback control if the deviation is at or below the threshold.

By this operation, it becomes less likely that a large deviation that occurs when, for example, the target rotational speed $\omega_T$ is switched will remain in the arithmetic result in the feedback filter 44, and overshooting in which the rotational speed $\omega$ exceeds the target rotational speed $\omega_T$ is prevented or reduced. From this viewpoint, the feedback filter 44 preferably resets the arithmetic result up to that point to the initial state when operation of the filter is stopped.

In the present embodiment, the rotational speed $\omega$ is represented by the count value of the count clock CLK within the pulse period $\tau_P$. Therefore, whether the speed is within the range $R_\Delta$ is determined on the basis of the difference $(C-C_N)$ between the measured count value C and the target count value $C_N$. For example, setting a designated threshold $\Delta_C$ can define the conditions so that the speed is within the range $R_\Delta$ if $|(C-C_N)| \leq \Delta_C$, and is out of the range $R_\Delta$ if $|(C-C_N)| > \Delta_C$.

[Measurement of Pulse Period $\tau_P$]

The pulse period measurement section 38 measures the pulse period $\tau_P$ by counting the count clock CLK in order to ascertain the rotational speed $\omega$. Accordingly, if the precision of detecting the pulse ends in the pulse signal PI is low, then the precision of motor speed control also decreases. Therefore, reducing the effect of chattering and other types of noise that may occur at the pulse ends is required.

Figure 3:
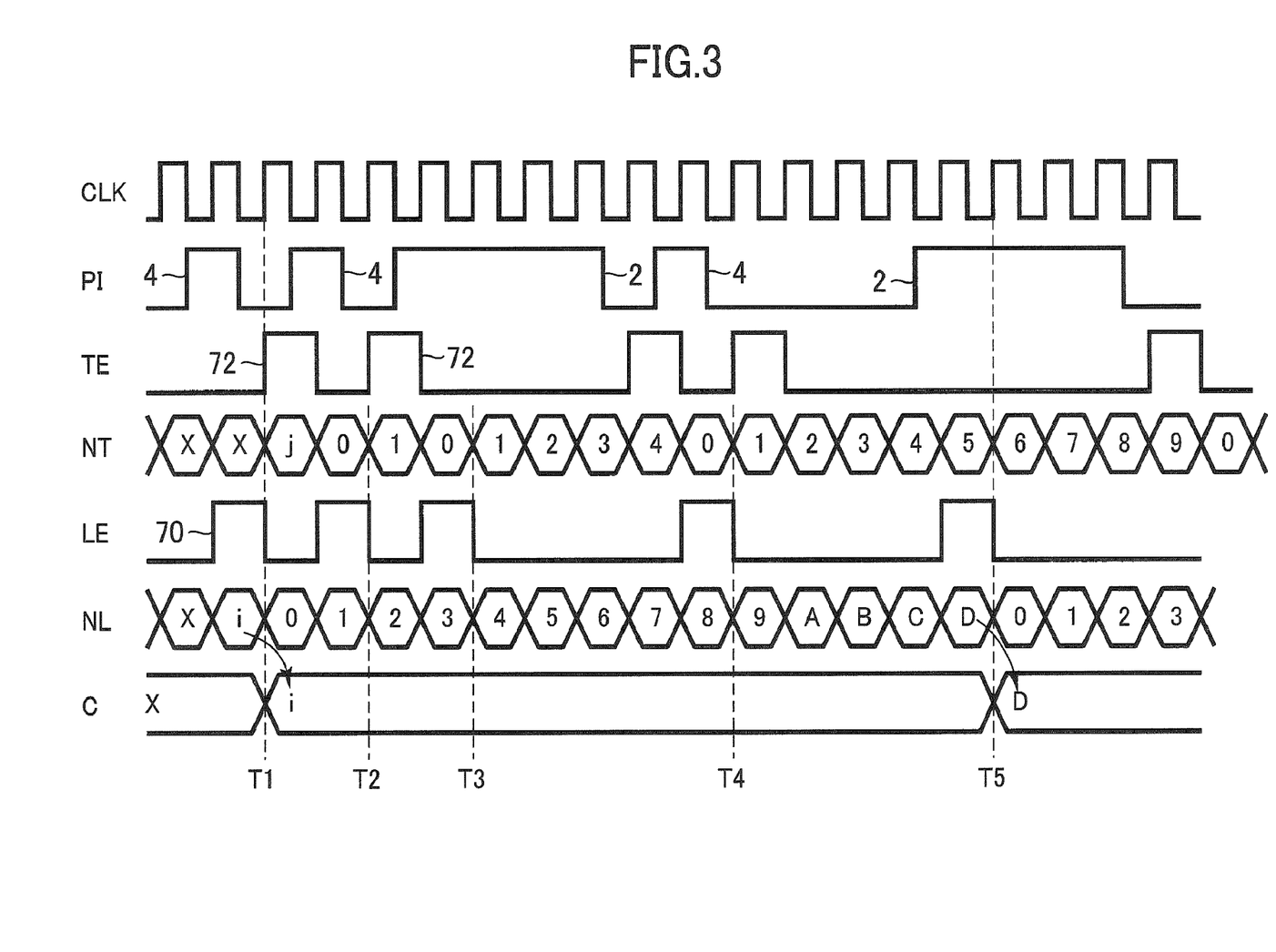
FIG. 3 is a signal waveform chart illustrating the pulse period measurement method of the motor speed controller according to an embodiment of the present invention.

FIG. 3 is a signal waveform chart illustrating the pulse period measurement method of the motor speed controller 20. In FIG. 3, the horizontal axis is the time axis, and the count clock CLK, the pulse signal PI, the fall (trailing edge) detection signal TE of the pulses in the pulse signal PI, the fall period count value NT, the rise (leading edge) detection signal LE of the pulses in the pulse signal, the rise period count value NL, and the count value C related to the pulse period $\tau_P$ are arrayed vertically, with their respective time axes in alignment.

In the example shown in FIG. 3, the motor speed controller 20 measures the pulse period $\tau_P$ on the basis of a pulse end in transition from an L-level state to an H-level state for the target pulses appearing in the pulse signal PI input to the motor speed controller 20 from the motor module 26.

The pulse period measurement section 38 samples the pulse signal PI, for example, at the timing of the rise of the count clock CLK supplied from the count clock generation circuit 40 (state detection step). In FIG. 3, the waveform 4 represents chattering that occurs at the leading and trailing edges of the pulse 2 of the pulse signal PI.

The pulse period measurement section 38 may start measuring the pulse period $T_P$ when the sampled value changes from L level to H level. Specifically, the pulse period measurement section 38 detects the change of the sampled value from L level to H level as the rise of the pulse signal PI, and generates a pulse 70 in the rise detection signal LE. The width of the pulse 70 is set to one period $\tau_{CLK}$ of the count clock CLK. When the pulse 70 rises, the pulse period measurement section 38 outputs as the measured count value C the present count value NL of a rise period counter for clocking the pulse period $\tau_P$ except in the case when the later-described exception handling is performed. This is a completion of measuring a pulse period $\tau_P$. The pulse period measurement section 38 begins the process of measuring a new pulse period $\tau_P$ from the period of the next count clock CLK (time T1). That is, the pulse period measurement section 38 resets the count value NL to 0 at time T1, and then begins incrementing by one the count value NL in synchronization with the count clock CLK.

The pulse period measurement section 38 begins clocking a designated inhibition period Pd when the sampled value changes from H level to L level (inhibition period clocking step). Specifically, the pulse period measurement section 38 detects the change of the sampled value from H level to L level as a fall of the pulse signal PI, and generates a pulse 72 to the fall detection signal TE. The width of the pulse 72 is set to $\tau_{CLK}$. When the pulse 72 rises, the pulse period measurement section 38 stops counting of the fall period counter up to then, and begins the process of clocking a new inhibition period Pd from the period of the next count clock CLK (time T1). That is, the pulse period measurement section 38 resets the count value NT to 0 at the fall of the pulse 72, and then begins incrementing by one the count value NT in synchronization with the count clock CLK.

In the case when there is no noise such as chattering, change of the pulse signal PI from L level to H level is understood as the rise of the target pulse, which is the object of counting the pulse period $\tau_P$. Therefore, in the case when a pulse 70 is generated, counting of the pulse period $\tau_P$ up to then is completed, and counting of the next pulse period $\tau_P$ can be started, as described above. However, in the case when there is noise such as chattering, change of the pulse signal PI from L level to H level also occurs at the rise of chattering or another noise pulse, and the pulse period measurement section 38 may detect this change and generate a pulse 70.

The noise may cause a fall of the pulse signal PI in mid-course of the target pulse, followed by a rise. The variation of the pulse signal PI is caused substantially within a range that is sufficiently short compared with the duration of the original H level of the target pulse. Therefore, if the elapsed time from the pulse 72 based on the preceding fall to the pulse 70 is less than a designated inhibition period, a determination is made that the variation of the pulse signal PI is due to noise, and counting of the pulse period $\tau_P$ already being performed at present is continued. This process is performed by the pulse period measurement section 38 as exception handling in the case when a pulse 70 is generated for the rise detection signal LE.

The inhibition period Pd described above, which is clocked by the count value NT of the fall period counter, is used for this analysis, and the period is set in accordance with an assumed value of the period of chattering occurring at the ends of target pulses.

In the example shown in FIG. 3, the inhibition period Pd is set to two clocks of the count clock CLK. If the count value NT at the time of generation of the pulse 70 is less than "2", then the pulse period measurement section 38 continues incrementing the count value NL (for example, at times T2, T3, and T4). On the other hand, if the count value NT at the time the pulse 70 is generated is "2" or more, then the count value NL is output at that time as a measured count value C that represents the pulse period $\tau_P$, the rise period counter is reset, and counting of the next pulse period $\tau_P$ is started (for example, at time T5).

In the conventional method, the position detected as the edge of the target pulses appearing in the pulse signal PI is at the timing after the chattering subsides. Therefore, the measurement values of the pulse period are varied by the variability of the chattering duration period, and a delay is caused in the detection of the pulse period $\tau_P$.

As opposed to this, according to the method of measurement of the pulse period $\tau_P$ in the motor speed controller 20, the measurement of the pulse period $\tau_P$ is started from a rise of the pulse signal PI before the chattering subsides, but in the case when the pulse is interrupted by short periods such as in chattering, the measurement of the pulse period $\tau_P$ is continued, as described above. Erroneous detection of chattering as the target pulses can thereby be suppressed. The measurement method makes it possible to measure pulse periods without being any effect from the variability of the periods of chattering in the forefronts of the pulses. Therefore, the pulse period $\tau_P$ can be measured with good precision. Because of a reduction in the delay until detection of the pulse period $\tau_P$, the stability of motor speed control can be improved.

The period of chattering is substantially proportional to the pulse period $\tau_P$ in the pulse signal PI. That is, it is preferable that the inhibition period Pd also be made proportional to the pulse period $\tau p$. Here, because the motor speed controller 20 varies the frequency $F_C$ of the count clock CLK in accordance with the target rotational speed $\omega_T$, the inhibition period Pd, which varies in proportion to the pulse period $\tau_P$, is a constant value that does not depend on the rotational speed $\omega$ when represented by the clock number of the count clock CLK. That is, the threshold (in the example in FIG. 3, "2") of the count value NT of the fall period counter, which is used for determining whether the inhibition period Pd has passed at the time of the rise of the pulse period PI (at the time of generation of the pulse 70), can be set as a constant value that does not depend on the rotational speed $\omega$.

[Countermeasures Against Out-Of-Control Reverse Rotation]

Because the pulse signal PI input from the motor module 26 to the motor speed controller 20 is monophase, the motor speed controller 20 cannot identify the direction of the rotational speed. There is a possibility that the motor speed controller 20 may encounter out-of-control reverse rotation of the motor. However, in the case of out-of-control reverse rotation, the motor speed controller 20 can detect this condition and restore the normal state. The motor speed controller 20 has an out-of-control reverse rotation determining section (not shown) for determining a state of out-of-control reverse rotation, and a restoration processor (not shown) for restoring the normal state. The out-of-control reverse rotation determining section and the restoration processor can be implemented, for example, using the pulse period measurement section 38, count clock generation circuit 40, feedback filter 44, PWM signal generation circuit 48, control register 34, and other components of the motor speed controller 20 performing a linked operation via the bus 50. As the out-of-control reverse rotation determining section and the restoration processor, an independent circuit block not shown in FIG. 1 may be provided, and the components of the motor speed controller 20 may be controlled in integrated fashion. This integral control can be implemented using the MPU 22, in which case the MPU 22 constitutes part of the motor speed controller related to the present invention.

In the out-of-control reverse rotation determining section, the composite signal generated by the synthesis circuit 46 is used as a monitored signal. In the case when a state continues for a designated period in which the control direction of the monitored signal with respect to the rotational speed $\omega$ is the reverse of the direction of the target rotational speed $\omega_T$, and in which the strength of the monitored signal exceeds a designated threshold, the out-of-control reverse rotation determining section determines the state of out-of-control reverse rotation in which the motor rotates out of control in the reverse of the direction of the target rotational speed $\omega_T$. When the out-of-control reverse rotation determining section detects the state of out-of-control reverse rotation, the restoration processor restores the rotational speed $\omega$ from the state of out-of-control reverse rotation toward the target rotational speed $\omega_T$. In the state of out-of-control reverse rotation, the compensation instruction signal is more dominant than the target instruction signal, making it possible to also use the compensation instruction signal as the monitored signal instead of the composite signal.

Figure 4:
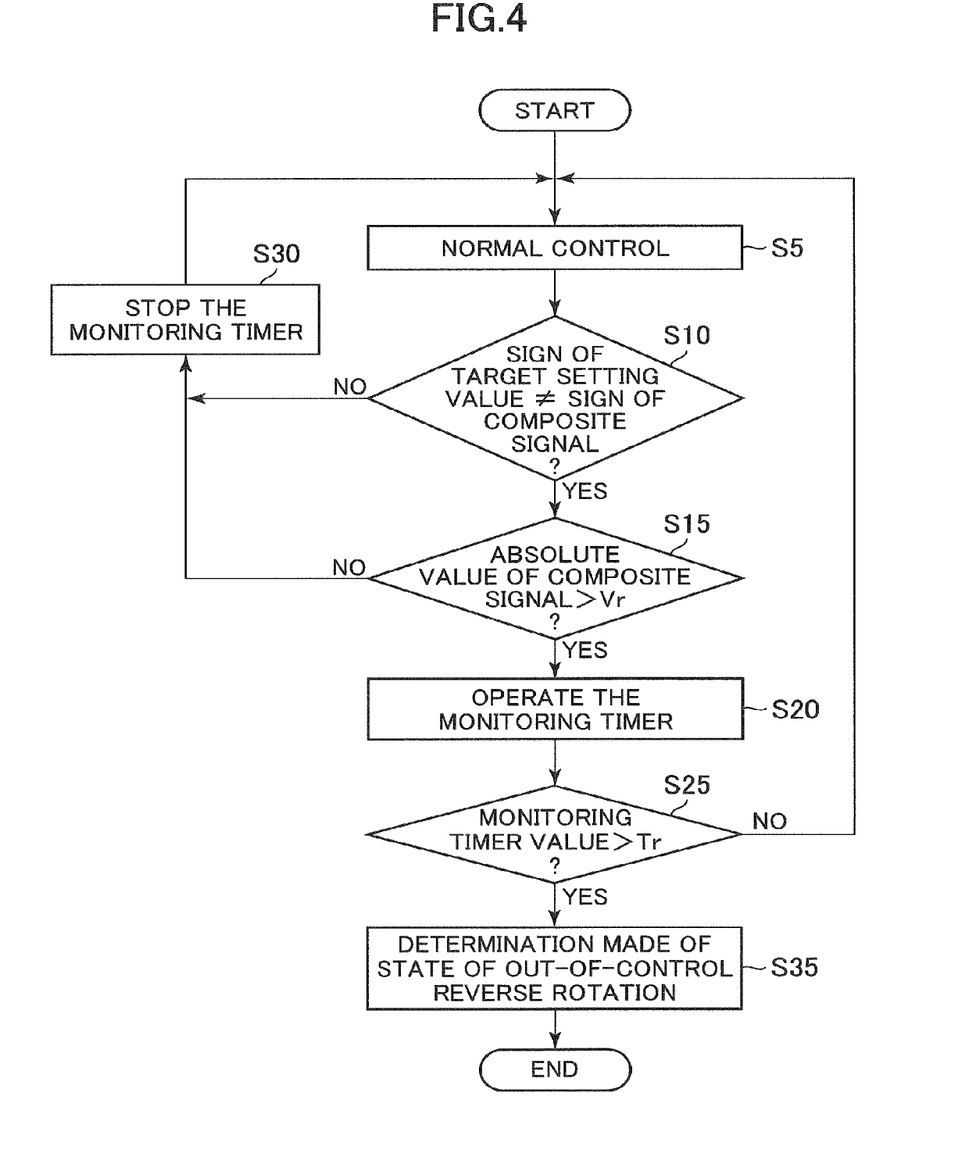
FIG. 4 is a flowchart illustrating the operation in which the state of out-of-control reverse rotation is determined by the motor speed controller according to an embodiment of the present invention.

FIG. 4 is a flowchart illustrating the operation for determining a state of out-of-control reverse rotation. The motor speed controller 20 operates under normal control if a state of out-out-control reverse rotation is not detected (S5). The out-of-control reverse rotation determining section monitors the motor for the occurrence of out-of-control reverse rotation during operation under normal control (S10 to S25).

The direction of the target rotational speed $\omega_T$ can be ascertained from the target setting value Kr set in the drive target register 30. The control direction of the monitored signal with respect to the rotational speed $\omega$ can be ascertained from the sign of the composite signal. Accordingly, a determination as to whether the control direction of the monitored signal with respect to the rotational speed $\omega$ is the reverse of the direction of the target rotational speed $\omega_T$ can be made based on whether the sign of the target setting value Kr is different from the sign of the composite signal (S10). If the signs are the same, a determination is made that the motor is not rotating out of control in reverse, and normal control S5 is continued.

On the other hand, in the case when the signs are different, a determination is made as to whether the strength of the monitored signal, that is, the absolute value exceeds a designated threshold Vr (S15). If the absolute value of the composite signal is at or below the threshold Vr, a determination is made that the motor is not rotating out of control in reverse, and normal control S5 is continued. The threshold Vr can, for example, be set to a comparatively high value to the extent that this value allows the drive signal generated by the motor drive circuit 24 to reach saturation.

A monitoring timer is operated (S20) in the case when the absolute value of the composite signal exceeds the threshold Vr. In the monitoring timer operation S20, the monitoring timer is started if it is in a stopped state, and the monitoring timer value is incremented if the timer is already started.

The out-of-control reverse rotation determining section determines whether the monitoring timer value exceeds a designated value Tr (S25). Normal control S5 is continued while the monitoring timer value is at or below Tr. The monitoring timer is stopped and reset (S30) if a determination is made that the motor is not rotating out of control in reverse during that period in processes S10 and S15. On the other hand, if the monitoring timer value exceeds Tr, a determination is made that the motor is in a state of out-of-control reverse rotation (S35), and the operation of restoration to the normal state is started.

Figure 5:
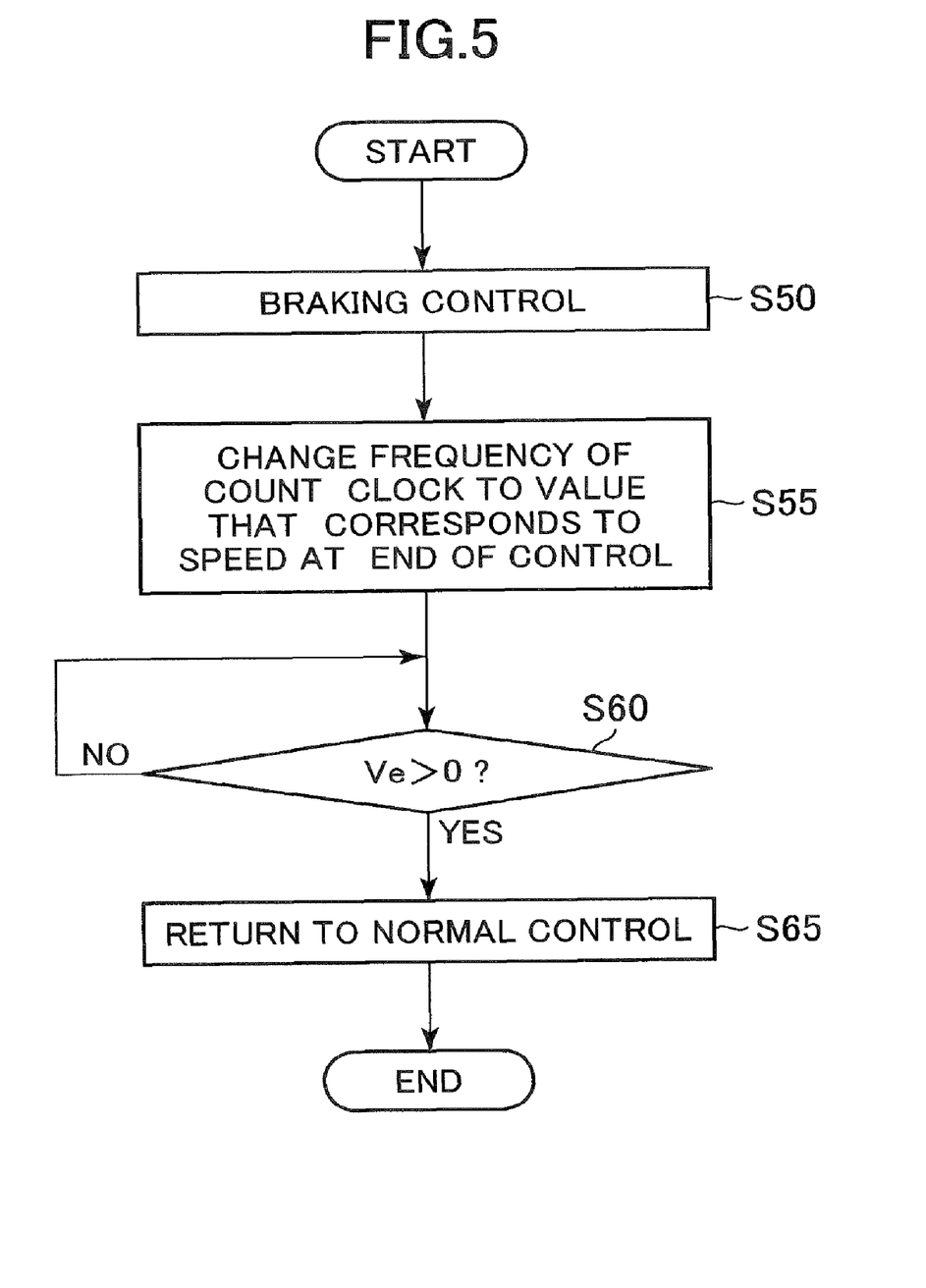
FIG. 5 is a flowchart illustrating the operation in which an original state has been restored by the motor speed controller according to an embodiment of the present invention.
Figure 6:
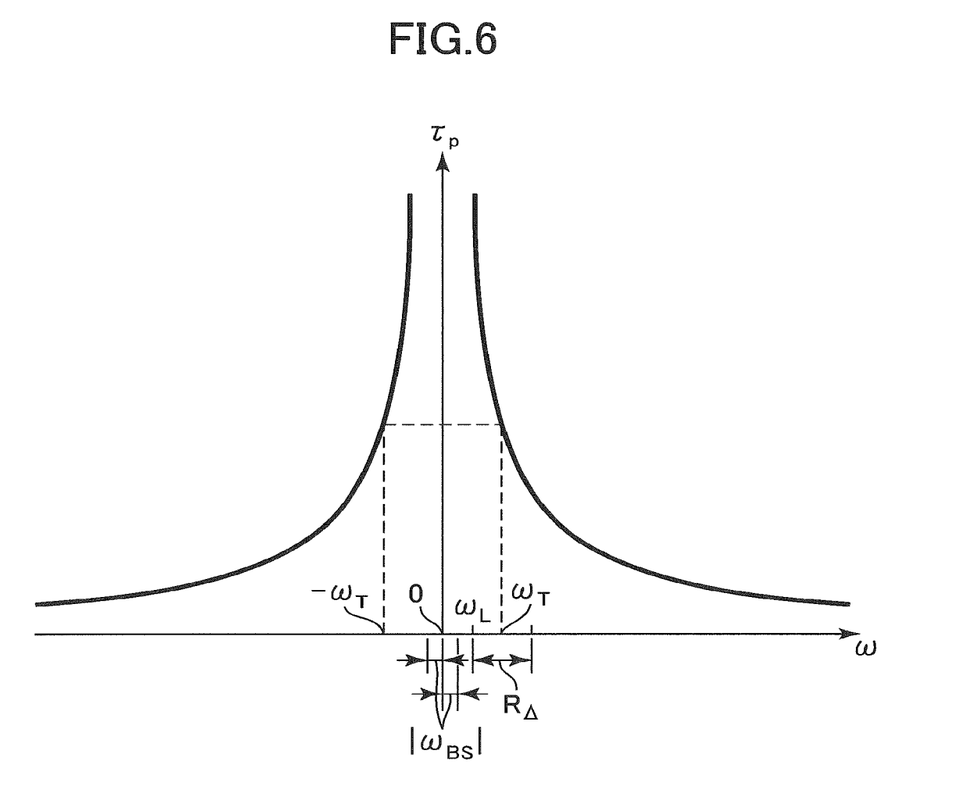
FIG. 6 is a view showing the relationship between rotational speed and pulse period illustrating the restoration operation.

FIG. 5 is a flowchart illustrating the operation in which a normal state is restored. FIG. 6 is a schematic view illustrating the restoration operation, and shows the relationship between rotational speed $\omega$ and pulse period $\tau_P$. In FIG. 6, the horizontal axis is rotational speed $\omega$, and the vertical axis is pulse period $\tau_P$.

The motor speed controller 20 moves to braking control in which the rotation of the motor is braked when a state of out-of-control reverse rotation is detected (S50). As braking control, a process may be performed, for example, in which the PWM signal generation circuit 48 sets the duty ratio of the PWM signal so that the motor drive circuit 24 generates in the motor a maximum driving force in the direction of stopping the rotation. The braking control may be based on another method; for example, it is also possible to use a short-circuit brake that forcibly short-circuits the terminals of the motor to stop the motor.

Here, as described above, a terminal braking speed $\omega_{BS}$ is set within a range in which the absolute value thereof is less than the limit $\omega_L$, of the low-speed side of the range $R_A$, and the braking control ends at the terminal braking speed $\omega_{BS}$ in the case when feedback control is performed only within a designated range $R_A$ that includes the target rotational speed $\omega_T$, and feedforward control alone is performed outside of the range $R_A$. Here, the lower-speed limit $\omega_L$ is either the lower limit or the upper limit of the range $R_A$, whichever has an absolute value less than that of the target rotational speed $\omega_T$. In the case when $\omega_T>0$, for example, the lower limit of the range $R_A$ is $\omega_L$.

Whether the rotational speed C has reached the terminal braking speed $\omega_{BS}$ can be determined on the basis of the measured count value C, which is measured by the pulse period measurement section 38. When a state of out-of-control reverse rotation is detected, the frequency $F_C$ of the count clock CLK is changed from a value that corresponds to the target rotational speed $\omega_T$ to a value that corresponds to terminal braking speed $\omega_{BS}$ (S55). The measured count value C at the terminal braking speed $\omega_{BS}$ is thereby matched with the target count value $C_N$ stored in the target count value register 32, and the error signal Ve at that time becomes 0.

For example, in the case when $\omega_{BS}$ is set within a range whose sign is opposite to that of the target rotational speed $C_T$, the condition $C-C_N<0$ is satisfied until $\omega$ reaches $\omega_{BS}$, that is, in the range $|\omega|>|\omega_{BS}|$, if braking is applied from the state of out-of-control reverse rotation; the condition $C-C_N=0$ is satisfied if $\omega=\omega_{BS}$; and the condition $C-C_N>0$ is satisfied if $\omega$ exceeds $\omega_{BS}$ to further approach the stopped state, and the condition $|\omega|<|\omega_{BS}|$ results. Therefore, the sign of the error signal Ve is monitored, and a determination can be made that the rotational speed $\omega$ has exceeded the terminal braking speed $\omega_{BS}$ when Ve>0 (S60).

Whether the rotational speed $\omega$ has reached the terminal braking speed $\omega_{BS}$ can also be determined from the sign of the target rotational speed $\omega_T$ (or the terminal braking speed $\omega_{BS}$) and the sign of the compensation instruction signal output from the feedback filter 44.

Normal control is restored (S65) when the terminal braking speed $\omega_{BS}$ is reached. In the operation of returning to normal control S65, the frequency $F_C$ of the count clock CLK is returned to a value that corresponds to the target rotational speed $\omega_T$. The motor is accelerated by feedforward control until $\omega$ reaches $\omega_L$. When $\omega$ reaches $\omega_L$, feedback control is started in addition to the feedforward control, and the normal state in which $\omega$ is kept to the target rotational speed $\omega_T$ is recovered. The motor is still rotating in the direction opposite from that of the target rotational speed $\omega_T$ at the point when normal control is restored in the case when $\omega_{BS}$ is set to a sign opposite to that of the target rotational speed $\omega_T$, but the motor is further decelerated by the feedforward control and is caused to go further past $\omega=0$ and start rotating in the same direction as the target rotational speed $\omega_T$. Also, when $\omega=\omega_L$, is reached, feedback control is started as described above.

In the case when the range $R_A$ for performing feedback control is not set, that is, in the case when feedforward control and feedback control are performed in parallel under normal control, the braking control must continue up to a rotational speed $\omega$ that does not resume the tend toward a state of out-of-control reverse rotation.

Here, speed $(-\omega_T)$, which has a reverse direction from, but the same magnitude as, the target rotational speed $\omega_T$, is the critical speed that serves as the boundary speed between tending toward out-of-control reverse rotation or tending toward the target rotational speed $\omega_T$ due to feedback control. In view of this, in the case when the range $R_A$ is not set, the braking control is continued until the motor reaches a designated terminal braking speed $\omega_{BS}$ having a smaller absolute value than the critical speed $(-\omega_T)$, and at the point when $|\omega_{BS}|>|\omega|$, the motor is returned to the original normal control in which the feedforward control means and the feedback control means are used.

Control in which $R_A$ is not set thus allows the terminal braking speed $\omega_{BS}$ to be set to a value that is substantially lower in absolute terms than the critical speed $(-\omega_T)$.

Although a pulse end in transition from a first state to a second state may possibly occur due to chattering, according to the present invention, measurement of pulse period is started from the pulse end. The measurement of pulse period is continued in the case when the pulse period is interrupted at short periods such as in chattering, whereby erroneous detection of the chattering as the target pulse is suppressed. This method makes it possible to measure pulse periods without any effect from the variability of the periods of chattering in the distal areas of the pulses, and to measure pulse periods more precisely.

What is claimed is:

1. A pulse period measurement method for measuring a pulse period on the basis of a pulse end in transition from a first state to a second state relative to a target pulse appearing in an input signal, comprising:
   a state detection step for sampling the input signal and detecting the signal state at a designated sampling period;
   a inhibition period clocking step for starting the process of clocking a designated inhibition period at a first change in which the signal state changes from the second state to the first state; and
   a period measurement step for completing the process of measuring the current pulse period and starting the process of measuring a new pulse period if the inhibition period has elapsed by the time of a second change in which the signal state changes from the first state to the second state, and continuing the process of counting the current pulse period if the inhibition period has not elapsed.

2. The pulse period measurement method of claim 1, wherein
   the state detection step detects the signal state in synchronization with a reference clock signal having the sampling period;
   the inhibition period clocking step starts the process of counting the reference clock at the time of the first change, and clocks the inhibition period on the basis of the count value; and
   the period measurement step starts the process of counting the reference clock at the time of the second change, and measures the pulse period on the basis of the count value.

3. The pulse period measurement method of claim 2, the method being used in controlling the pulse period and bringing the period to a target period; wherein
   the sampling period is variably set in accordance with the target period.

4. The pulse period measurement method of claim 3, wherein
   the sampling period is proportional to the target period; and
   the count value of the reference clock in the inhibition period is set to a constant value.

5. The pulse period measurement method of claim 1, wherein
   the inhibition period is set in accordance with the assumed value of the period of chattering produced at the pulse ends.

* * * * *